US012406926B2

(12) United States Patent
Zhao et al.

(10) Patent No.: US 12,406,926 B2
(45) Date of Patent: Sep. 2, 2025

(54) MICROELECTRONIC DEVICES INCLUDING STADIUM STRUCTURES

(71) Applicant: Micron Technology, Inc., Boise, ID (US)

(72) Inventors: Bo Zhao, Boise, ID (US); Matthew J. King, Boise, ID (US); Jason Reece, Boise, ID (US); Michael J. Gossman, Meridian, ID (US); Shruthi Kumara Vadivel, Boise, ID (US); Martin J. Barclay, Middleton, ID (US); Lifang Xu, Boise, ID (US); Joel D. Peterson, Boise, ID (US); Matthew Park, Boise, ID (US); Adam L. Olson, Boise, ID (US); David A. Kewley, Boise, ID (US); Xiaosong Zhang, Boise, ID (US); Justin B. Dorhout, Boise, ID (US); Zhen Feng Yow, Singapore (SG); Kah Sing Chooi, Singapore (SG); Tien Minh Quan Tran, Singapore (SG); Biow Hiem Ong, Singapore (SG)

(73) Assignee: Micron Technology, Inc., Boise, ID (US)

(*) Notice: Subject to any disclaimer, the term of this patent is extended or adjusted under 35 U.S.C. 154(b) by 771 days.

(21) Appl. No.: 17/564,633

(22) Filed: Dec. 29, 2021

(65) Prior Publication Data
US 2023/0063178 A1   Mar. 2, 2023

Related U.S. Application Data

(60) Provisional application No. 63/238,426, filed on Aug. 30, 2021.

(51) Int. Cl.
*H01L 23/528* (2006.01)
*H01L 21/768* (2006.01)
*H01L 23/522* (2006.01)

(52) U.S. Cl.
CPC .... *H01L 23/5283* (2013.01); *H01L 21/76816* (2013.01); *H01L 21/76877* (2013.01); *H01L 23/5226* (2013.01)

(58) Field of Classification Search
CPC .......... H01L 23/5283; H01L 21/76816; H01L 21/76877; H01L 23/5226
See application file for complete search history.

(56) References Cited

U.S. PATENT DOCUMENTS

| | | | |
|---|---|---|---|
| 9,455,268 B2 * | 9/2016 | Oh .................. | H10B 43/50 |
| 2015/0028410 A1 | 1/2015 | Kato | |

(Continued)

OTHER PUBLICATIONS

International Search Report for International Application No. PCT/US2022/075623, mailed Dec. 26, 2022, 3 pages.

(Continued)

*Primary Examiner* — Eugene Lee
(74) *Attorney, Agent, or Firm* — TraskBritt

(57) ABSTRACT

A microelectronic device includes a stack structure including a vertically alternating sequence of conductive structures and insulating structures arranged in tiers, a dielectric-filled opening vertically extending into the stack structure and defined between two internal sidewalls of the stack structure, a stadium structure within the stack structure and comprising steps defined by horizontal ends of at least some of the tiers, a first ledge extending upward from a first uppermost step of the steps of the stadium structure and interfacing with a first internal sidewall of the two internal sidewalls of the stack structure, and a second ledge extending upward from a second, opposite uppermost step of the steps of the stadium structure and interfacing with a second, opposite internal sidewall of the two internal sidewalls.

14 Claims, 11 Drawing Sheets

(56) References Cited

U.S. PATENT DOCUMENTS

| | | |
|---|---|---|
| 2017/0033117 A1* | 2/2017 | Lee .................. H01L 21/76879 |
| 2018/0166384 A1 | 6/2018 | Lee |
| 2020/0144292 A1 | 5/2020 | Lee |
| 2020/0161326 A1 | 5/2020 | Oh et al. |
| 2020/0294850 A1 | 9/2020 | Lee |
| 2020/0295028 A1 | 9/2020 | Kim et al. |
| 2020/0303411 A1* | 9/2020 | Baek .................. H01L 23/5283 |
| 2021/0091109 A1 | 3/2021 | Kang et al. |
| 2021/0098476 A1 | 4/2021 | Hong |
| 2021/0151455 A1 | 5/2021 | Xu et al. |
| 2021/0384124 A1* | 12/2021 | Wang ..................... H10B 41/27 |

OTHER PUBLICATIONS

International Written Opinion for International Application No. PCT/US2022/075623, mailed Dec. 26, 2022, 5 pages.
European Extended Search Report and Opinion for European Application No. 22865717.7, dated Nov. 27, 2024, 11 pages.

\* cited by examiner

MICROELECTRONIC DEVICES INCLUDING STADIUM STRUCTURES

CROSS-REFERENCE TO RELATED APPLICATION

This application claims the benefit under 35 U.S.C. § 119(e) of U.S. Provisional Patent Application Ser. No. 63/238,426, filed Aug. 30, 2021, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and hence, the quantity of staircase structures and/or the quantity of steps in individual staircase structures) of a stack structure without undesirably increasing the overall width (e.g., lateral footprint) of the stack structure can result in undesirably micro-trenching within the staircase structures, leading to failure of the vertical memory array.

DETAILED DESCRIPTION

Figure 1A:
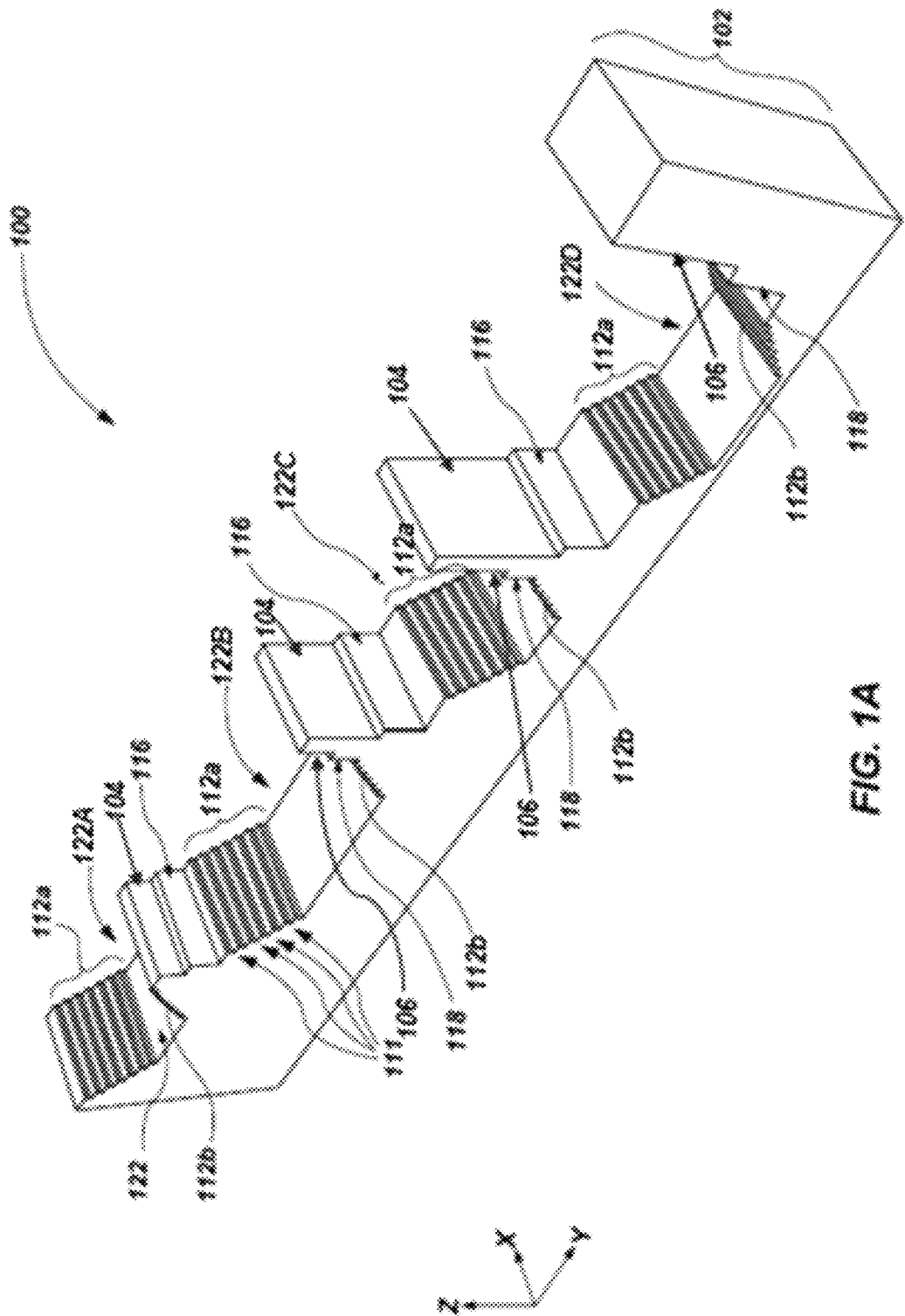
FIG. 1A and FIG. 1B are a simplified, perspective view (FIG. 1A) and a simplified, cross-sectional view (FIG. 1B) of a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular (e.g., normal) to the major plane of the substrate. The major plane of the substrate is defined by a surface of the substrate having a relatively large area compared to other surfaces of the substrate.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, a material is "selectively etchable" relative to another material if the material exhibits an etch rate that is at least about five times (5×) greater than the etch rate of another material during exposure to the same etching agent (e.g., etchant), such as about ten times (10×) greater, about twenty times (20×) greater, or about forty times (40×) greater.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

Embodiments described herein include methods for depositing and removing photoresist material prior to a "last" staircase chop etch for finalizing a vertical position of a given staircase stadium structure within a stack structure. For example, sidewalls extending upward from a given stadium structure within a stack structure may be covered by the photoresist material having a selected thickness and profile. The photoresist material may be utilized to absorb ion deflection off of the sidewalls during the chop etch while providing a etch profile that reduces and/or prevents unintentional micro-trenching within the stadium structure.

Embodiments of the disclosure include a microelectronic device includes a stack structure including a vertically alternating sequence of conductive structures and insulating structures arranged in tiers, a dielectric-filled opening vertically extending into the stack structure and defined between two internal sidewalls of the stack structure, a stadium structure within the stack structure and comprising steps defined by horizontal ends of at least some of the tiers, a first ledge extending upward from a first uppermost step of the steps of the stadium structure and interfacing with a first internal sidewall of the two internal sidewalls of the stack structure, and a second ledge extending upward from a second, opposite uppermost step of the steps of the stadium structure and interfacing with a second, opposite internal sidewall of the two internal sidewalls.

Additional embodiments of the disclosure include a microelectronic device, including a first stadium structure within a stack structure including tiers of conductive structures vertically interleaved with insulative structures, the first stadium structure comprising opposing staircase structures including steps defined by horizontal ends of a first group of the tiers of the stack structure, a first ledge vertically overlying first stadium structure and including horizontal ends of a second group of the tiers of the stack structure, the horizontal ends each terminating at a first horizontal position, a second ledge horizontally opposing the first ledge and including additional horizontal ends of the second group of the tiers of the stack structure, the additional horizontal ends each terminating at a second horizontal position different than the first horizontal position, and opposing sidewalls vertically overlying the first ledge and the second ledge and comprising further horizontal ends of a third group of the tiers of the stack structure, the further horizontal ends horizontally offset from all of the horizontal ends and all of the additional horizontal ends.

Embodiments of the disclosure further include a method of forming a microelectronic device, the method including: forming an initial stadium structure in a stack structure, the stack structure defining two internal sidewalls extending upward from uppermost steps of the initial stadium structure; forming photoresist coatings over the two internal sidewalls, the photoresist coatings defining an opening over the initial stadium structure; and removing portions of the stack structure vertically underlying and within a horizontal area of the opening to form a final stadium structure at a relatively lower vertical position within the stack structure than the initial stadium structure.

Additional embodiments of the disclosure include an electronic system, including an input device, an output device, a processor device operably coupled to the input device and the output device, and a memory device operably coupled to the processor device and comprising at least one microelectronic device. The at least one microelectronic device may include a first stadium structure formed at a first vertical position within a stack structure, a first set of ledges extending upward from uppermost steps of the first stadium structure and vertically spanning a first group of tiers of the stack structure, a second stadium structure formed at a second vertical position and vertically spanning the first group of tiers as the first set of ledges, and a second set of ledges extending upward from uppermost steps of the second stadium structure and vertically spanning a second group of tiers of the stack structure.

The structures and methods for finalizing vertical positions of stadium structures within a stack structure described herein may provide advantages over conventional structures and methods for forming microelectronic devices. For example, conventional chop etch processes typically utilized to lower stadium structures within a stack structure often result in unintentional micro trenches being formed through one or more steps of a final stadium structure and can cause failure of the microelectronic device. In contrast, coating sidewalls defining an opening exposing an initial stadium structure with a photoresist material and then etching (e.g., chop etching) the stack structure and the initial stadium structure to finalize a vertical position of a final stadium structure while the sidewalls are covered with photoresist material may reduce and/or prevent unintentional micro-trenching in the final stadium structure. In particular, during removal processes (e.g., etching), the photoresist material coatings may absorb ion deflection off of the sidewalls, which otherwise may cause the micro-trenching in the final stadium structure. Therefore, by absorbing the ions deflected off of the sidewalls, the photoresist material coatings may prevent the ions from being deflected into the final stadium structure and causing micro-trenching in the stadium structure.

Figure 1B:
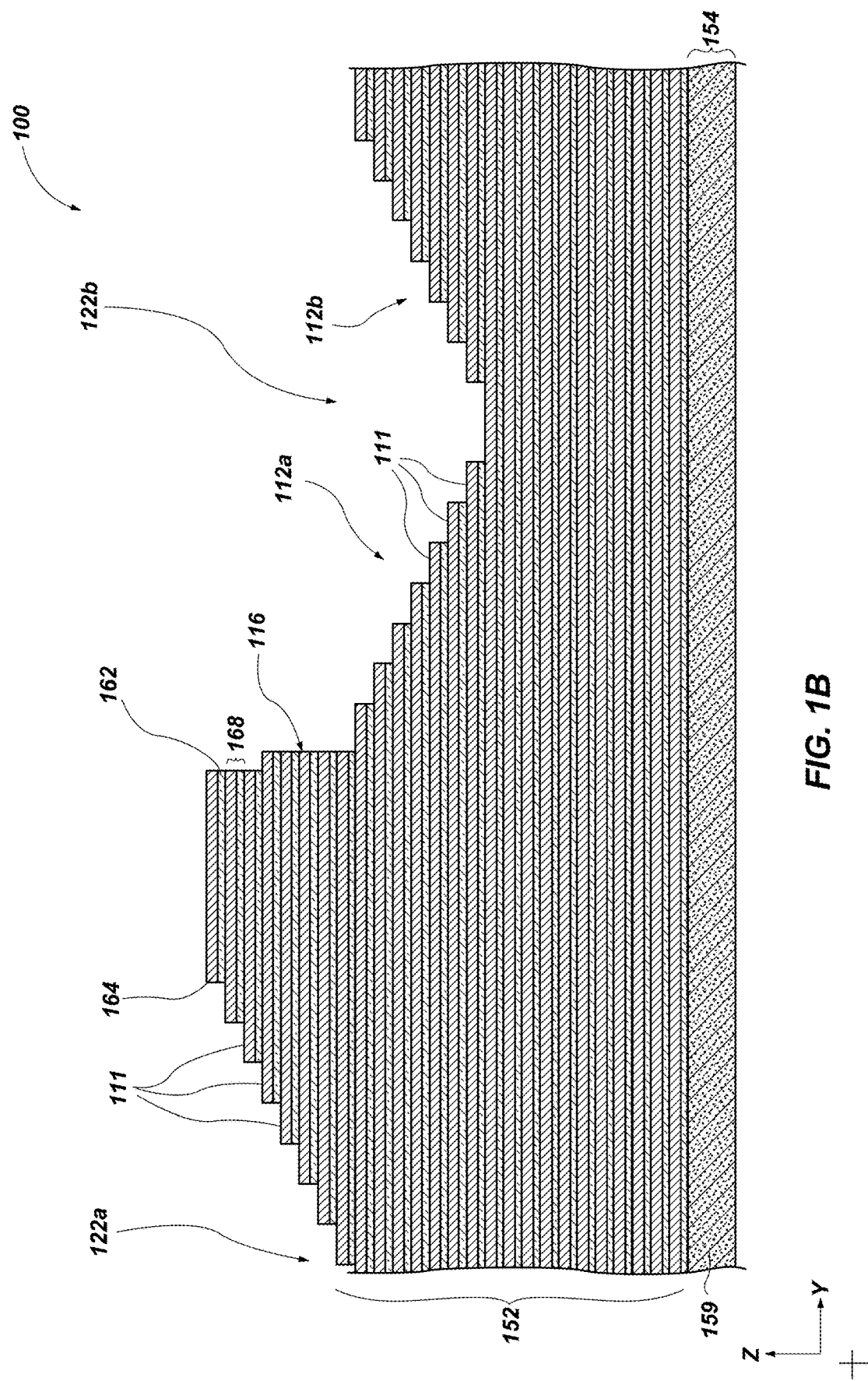

FIG. 1A and FIG. 1B show a microelectronic device structure 100 for a microelectronic device (e.g., a memory device, such as a 3D NAND Flash memory device), in accordance with embodiments of the disclosure. In particular, FIG. 1A is a simplified, partial perspective view of the microelectronic device structure 100. FIG. 1B is a simplified, partial cross-sectional view of the microelectronic device structure 100 shown in FIG. 1A about a ZY plane. With the description provided below, it will be readily apparent to one of ordinary skill in the art that the methods and structures described herein may be used for various devices and electronic systems.

The microelectronic device structure 100 may represent a structure post (e.g., subsequent to) one or more so-called "replacement gate" or "gate last" processes. For example, the microelectronic device structure 100 may include a structure formed by at least partially replacing sacrificial materials (e.g., dielectric material, such as dielectric nitride material) of sacrificial structures with one or more conductive materials (e.g., at least one metal, such as tungsten (W)). Replacement gate processing acts may include selectively removing (e.g., selectively etching and/or exhuming) portions of the sacrificial structures of a preliminary stack structure through slots formed in the preliminary stack structure, and the filling the resulting void spaces with conductive material (e.g., W) to form the conductive structures. As is described herein, some of the conductive structures may function as access line structures (e.g., word line structures) for the microelectronic device structure 100, and some other of the conductive structures may function as select gate structures for the microelectronic device structure 100. At least one lower conductive structure of the stack structure formed from the preliminary stack structure may be employed as at least one lower select gate (e.g., at least one source side select gate (SGS)) of the microelectronic device structure 100. In some embodiments, a single (e.g., only one) conductive structure of a vertically lowermost tier of the stack structure is employed as a lower select gate (e.g., an SGS) of the microelectronic device structure 100. In addition, upper conductive structures of the stack structure may be employed as upper select gates (e.g., drain side select gates (SGDs)) of the microelectronic device structure 100. In some embodiments, horizontally neighboring conductive structures of one or more vertically upper tiers of the stack structure are employed as upper select gates (e.g., SGDs) of the microelectronic device structure 100.

Thus, as shown in FIG. 1B, the microelectronic device structure 100 may include a stack structure 152 including a vertically alternating (e.g., in the Z-direction) sequence of insulative structures 162 and conductive structures 164 (e.g., gate structures, word lines) arranged in tiers 168. Each of the tiers 168 of the stack structure 152 may include at least one of the insulative structures 162 vertically neighboring at least one of the conductive structures 164. The stack structure 152 may include a desired quantity of the tiers 168. For example, the stack structure 152 may include greater than or equal to ten (10) of the tiers 168, greater than or equal to twenty-five (25) of the tiers 168, greater than or equal to fifty (50) of the tiers 168, greater than or equal to one hundred (100) of the tiers 168, greater than or equal to one hundred and fifty (150) of the tiers 168, or greater than or equal to two hundred (200) of the tiers 168 of the insulative structures 162 and the conductive structures 164.

A source tier 154 vertically underlies (e.g., in the Z-direction) the stack structure 152 and includes at least one source structure 159 (e.g., a source plate). The source structure 159 may be formed of and include conductive material, such as one or more of the conductive materials described above. In some embodiments, the source tier 154 includes the at least one source structure 159 and one or more discrete structures.

The insulative structures 162 of the tiers 168 of the stack structure 152 may be formed of and include insulative material, such one or more of the insulative materials described above. In some embodiments, the insulative structures 162 are formed of and include $SiO_x$ (e.g., $SiO_2$). Each of the insulative structures 162 may individually include a substantially homogeneous distribution of the insulative material, or a substantially heterogeneous distribution of the insulative material. In some embodiments, each of the insulative structures 162 is substantially homogeneous. In additional embodiments, at least one of the insulative structures 162 is substantially heterogeneous. The insulative structures 162 may, for example, be formed of and include a stack (e.g., laminate) of at least two different insulative materials. The insulative structures 162 of each of the tiers 168 of the stack structure 152 may each be substantially planar, and may each individually exhibit a desired thickness.

The conductive structures 164 of each of the tiers 168 of the stack structure 152 may be formed of and include conductive material, such as one or more of the conductive materials described above. For instance, as noted above, the conductive structures 164 may be formed of and include tungsten (W). The conductive structures 164 may be substantially homogeneous, or may be substantially heterogeneous. In some embodiments, the conductive structures 164 are substantially homogeneous. In additional embodiments, the conductive structures 164 are substantially heterogeneous. The conductive structures 164 of each of the tiers 168 of the stack structure 152 may each be substantially planar, and may each individually exhibit a desired thickness.

The stack structure 152 may include at least one stair step structure 112 (which may also be referred to herein as at least one "staircase structure") therein. The stair step structure 112 may include steps 111 defined by edges (e.g., horizontal ends) of at least some of the tiers 168 of the stack structure 152. In some embodiments, the stack structure 152 includes at least one stadium structure 122 comprising two (e.g., a pair) of stair step structures 112a, 112b horizontally opposing one another in the Y-direction. In addition, as shown in FIG. 1A, in some embodiments, the stack structure 152 includes multiple stadium structures 122 therein, and at least one of the stadium structures 122 is located closer to the source tier 154 (e.g., a common source plate (CSP)) than at least one other of the stadium structures 122. Stated another way, the steps 111 of one stadium structure 122 may be located closer to the source tier 154 than the steps 111 of another stadium structure 122. For example, the microelectronic device structure 100 may include a first stadium structure 122A, a second stadium structure 122B at a relatively lower vertical position (e.g., in the Z-direction) within the stack structure 102 than the first stadium structure 122A, a third stadium structure 122C at a relatively lower vertical position within the stack structure 102 than the second stadium structure 122B, and a fourth stadium structure 122D at a relatively lower vertical position within the stack structure 102 than the third stadium structure 122C. The different vertical positions of the different stadium structures 122 (e.g., the first stadium structure 122A, the second stadium structure 122B, the third stadium structure 122C, the fourth stadium structure 122D) permit electrical connections between the conductive structures 164 of the tiers 168 at the different vertical positions of the different stadium structures 122 and other components (e.g., the string drivers) of a microelectronic device including the microelectronic device structure 100.

The stack structure 102 may include any desired quantity and distribution (e.g., spacing and arrangement) of the stadium structures 122. For example, as mentioned above, in some embodiments, the stack structure 102 includes four (4) of the stadium structures 122; the stadium structures 122 are substantially uniformly (e.g., equally, evenly) spaced; and vertical positions (e.g., in the Z-direction) of the stadium structures 122 within the stack structure 102 become deeper (e.g., vertically farther from a uppermost surface of the stack structure 102, vertically closer to the lowermost surface of the stack structure 102) in a direction (e.g., the Y direction) horizontally extending away from a memory array region of the stack structure 102. In further embodiments, the stack structure 102 includes more than four (4) of the stadium structures 122 (e.g., greater than or equal to five (5) of the stadium structures 122, greater than or equal to ten (10) of the stadium structures 122, greater than or equal to twenty-five (25) of the stadium structures 122, greater than or equal to fifty (50) of the stadium structures 122), or less than four (4) of the stadium structures 122 (e.g., less than or equal to three (3) of the stadium structures 122, less than or equal to two (2) of the stadium structures 122, only one (1) of the stadium structures 122). As another example, the stadium structures 122 may be at least partially non-uniformly (e.g., non-equally, non-evenly) spaced, such that at least one of the stadium structures 122 is separated from at least two other of the stadium structures 122 laterally-neighboring (e.g., in the X-direction) the at least one stadium structure 122 by different (e.g., non-equal) distances. As an additional non-limiting example, vertical positions (e.g., in the Z-direction) of the stadium structures 122 within the stack structure 102 may become shallower (e.g., vertically closer to a uppermost surface of the stack structure 102, vertically farther from the lowermost surface of the stack structure 102) in a direction (e.g., the Y direction) horizontally extending away from the memory array region of the stack structure 102, or may vary in another manner (e.g., may alternate between relatively deeper and relatively shallower vertical positions, may alternate between relatively shallower and relatively deeper vertical positions) in a direction horizontally extending away from the memory array region of the stack structure 102.

As shown in FIG. 1A, in some embodiments, the steps 111 of each of the stair step structures 112 are arranged in order, such that steps 111 directly horizontally adjacent to one another (e.g., in the Y-direction) correspond to tiers 168 of the stack structure 152 directly vertically adjacent one another. In additional embodiments, the steps 111 of at least one of the stair step structures 112 are arranged out of order, such that at least some steps 111 of the stair step structure 112 directly horizontally adjacent one another in the horizontal direction correspond to tiers 168 of stack structure 152 not directly vertically adjacent one another.

Referring still to FIGS. 1A and 1B together, the stack structure 152 may include ledges 116, 118 (e.g., ledge structures) extending upward from uppermost steps 111 of one or more of the stadium structures 122 and extending horizontally from internal sidewalls 104, 106 of the stack structure 152. As is described in greater detail below, the ledges 116, 118 may exhibit high-aspect-ratio dimensions within a vertical plane (e.g., the ZY plane depicted in FIG. 1). As is also described in greater detail below, the ledges 116, 118 may span multiple tiers 168 in a vertical direction (e.g., Z-direction).

Figure 2A:
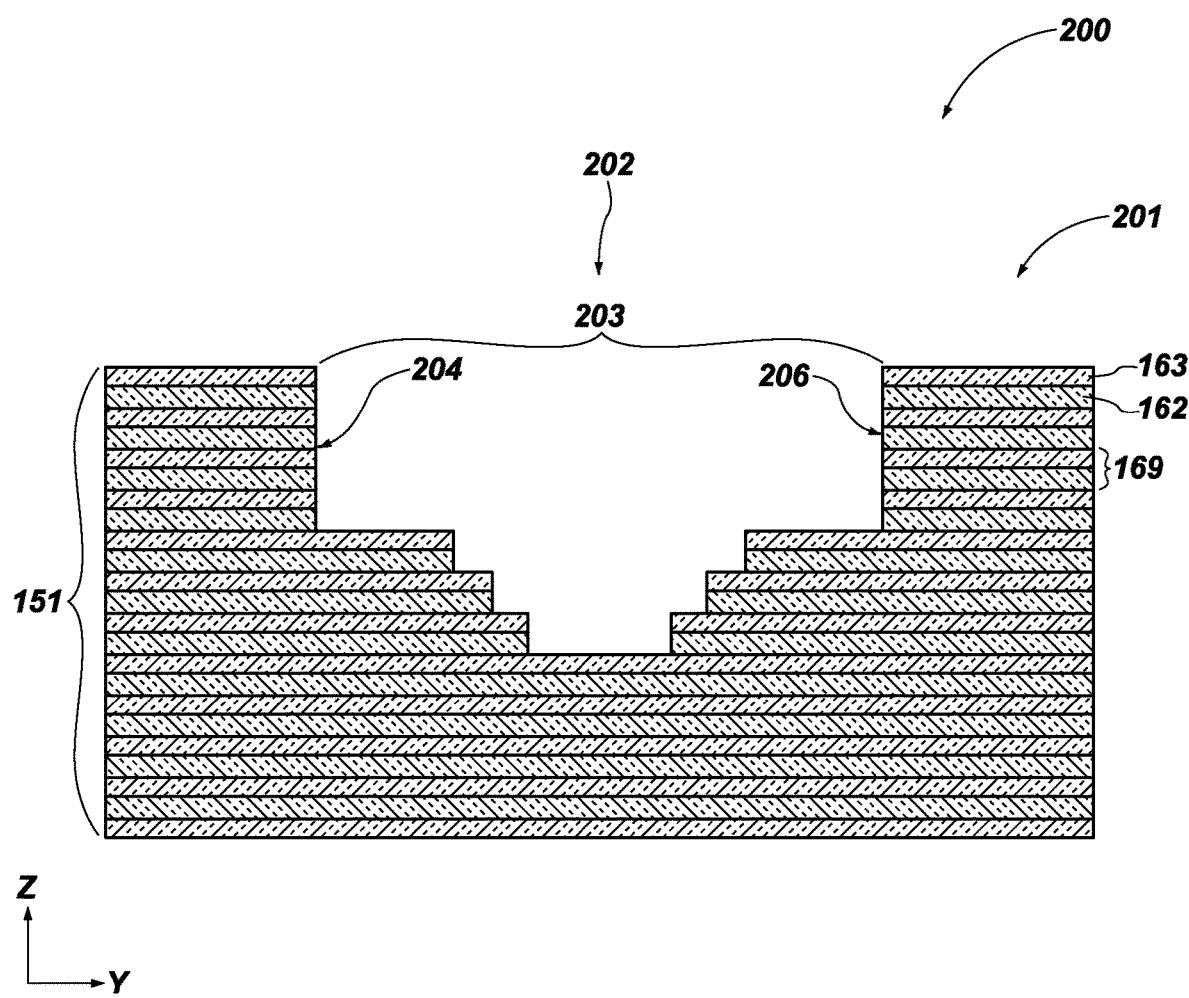
FIG. 2A through FIG. 2F are simplified, partial cross-sectional views (FIGS. 2A through 2E) and a simplified, partial perspective view (FIG. 2F) illustrating a method of forming a microelectronic device structure, in accordance with embodiments of the disclosure.

FIGS. 2A-2F show various views of a microelectronic device structure 201 at varying stages of a method 200 of forming the microelectronic device structure 201. Subsequent to a final processing act of the method 200, the microelectronic device structure 201 may be subjected to the replacement gate processing previously described herein to become the microelectronic device structure 100 described above with reference to FIGS. 1A and 1B. Referring to FIG. 2A, the microelectronic device structure 201 is formed to include a preliminary stack structure 151 including a vertically alternating sequent of the insulative structures 162 and sacrificial structures 163 arranged in tiers 169. The sacrificial structures 163 may subsequently be at least partially replaced with the conductive structures 164 (FIG. 1B) via the replacement gate processing to form the tiers 168 (FIG. 1B) of the stack structure 152 (FIG. 1). A method 200 described with reference to FIGS. 2A-2F may finalize vertical positions of stair step structures (e.g., stadium structures) within the preliminary stack structure 151 and well as in the stack structure 152 (FIG. 1B) formed therefrom. The final stadium structures described in regard to the method 200 may include any of the stadium structures 122 described above in regard to FIGS. 1A and 1B.

Referring to FIG. 2A, the method 200 may include forming at least one initial stadium structure 202 within the preliminary stack structure 151. Formation of the initial stadium structure 202 may include, for example, forming a first mask (e.g., a chop mask) over the preliminary stack structure 151 and forming an opening in the first mask at a location corresponding to the desired locations of a first stair step structure and a second stair step structure of the initial stadium structure 202 and removing portions of the tiers 169 of the insulative structures 162 and sacrificial structures 163 through the opening in the first mask. After removing portions of the tiers 169 of the insulative structures 162 and the sacrificial structures 163 through the opening in the first mask, the first mask may be removed. Thereafter, a second mask material (e.g., a photoresist material) may be formed over the preliminary stack structure 151 and one or more openings may be formed therein at locations corresponding to the first stair step structure and the second stair step structure of the initial stadium structure 202 to form a second mask and expose portions of a first underlying tier 169 of the insulative structure 162 and the sacrificial structure 163. The exposed portions of the first underlying tier 169 may then be removed (e.g., etched). The second mask may then be exposed to a trim chemistry to trim the second mask and enlarge the one or more openings therein so as to expose additional portions of the first underlying tier 169 at least one width corresponding to a width (in the Y-direction) of a step 111 (FIG. 1). After trimming the second mask, portions of first underlying tier 169 and a second underlying tier 169 below the first underlying tier 169 within a horizontal area of the enlarged opening in the second mask may be removed to form steps within the preliminary stack structure 151. The process of trimming the second mask and removing portions of underlying tiers 169 may be repeated a desired number of times (e.g., until a desired number of steps 111 is obtained) to form the first stair step structure and the second stair step structure of the initial stadium structure 202.

If multiple initial stadium structures 202 are formed, one or more of the initial stadium structures 202 may subjected to additional removal processes (e.g., chop etches) to vertically offset at least one of the initial stadium structures 202 from at least one other of the initial stadium structures 202 within the preliminary stack structure 151. As shown in FIG. 2A, in some embodiments, sidewalls 204, 206 (e.g., vertical and internal sidewalls) of the preliminary stack structure 151 extend between at least one initial stadium structure 202 and an uppermost tier 169 of the preliminary stack structure 151. In particular, the sidewalls 204, 206 may extend vertically upward from uppermost boundaries (e.g., uppermost surfaces) of uppermost steps 111 (FIG. 1B) of the initial stadium structure 202 to an uppermost boundary of the uppermost tier 169 of the preliminary stack structure 151. Moreover, the sidewalls 204, 206 may at least partially define an initial opening 203 over the initial stadium structure 202.

Figure 2B:
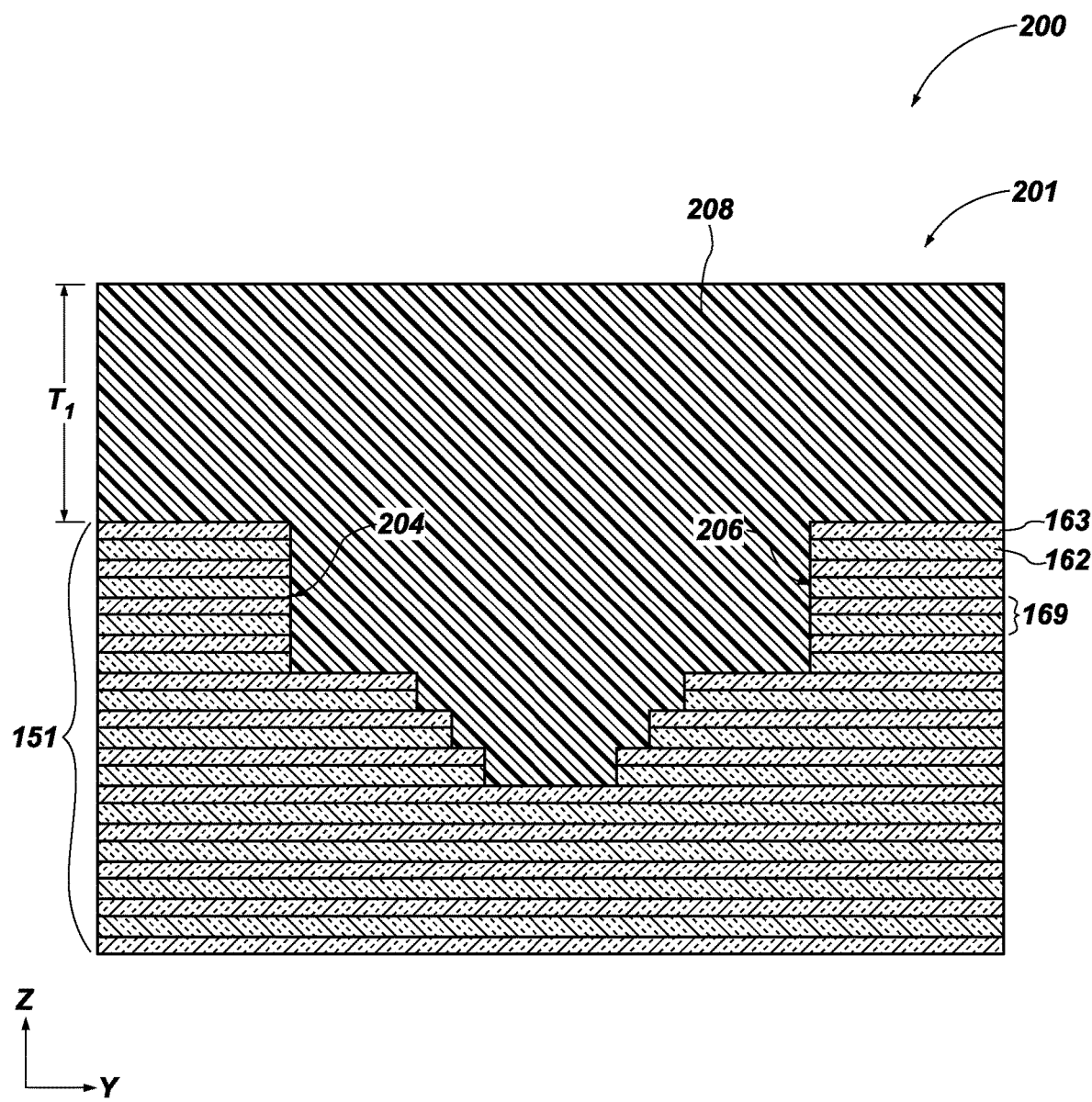

Referring to FIG. 2B, prior to performing a final removal process (e.g., chop etch) to establish (e.g., finalize) a vertical position of at least one final stadium structure 214 (FIG. 2E) formed from (e.g., based on) the at least one initial stadium structure 202, the method 200 may include forming (e.g., depositing) a photoresist material 208 over the initial stadium structure 202. Put another way, prior to lowering at least a portion of a stadium structure pattern defined by the initial stadium structure 202 to a lower vertical position within the preliminary stack structure 151 to form the final stadium structure 214 (FIG. 2E), the photoresist material 208 may be formed over the initial stadium structure 202. In some embodiments, the photoresist material 208 comprises a positive tone photoresist material. In additional embodiments, the photoresist material 208 comprises a negative tone photoresist material. The photoresist material 208 may be formed of and include any conventional chemically amplified resist materials.

Furthermore, forming the photoresist material 208 over the initial stadium structure 202 may include forming the photoresist material 208 to have a vertical thickness ($T_1$) above an uppermost tier 169 of the preliminary stack structure 151 within a range of from about 7.0 μm to about 10.0 μm. As a non-limiting example, forming the photoresist material 208 over the initial stadium structure 202 may include forming the photoresist material 208 to have a thickness ($T_1$) of about 8.5 μm.

Figure 2C:
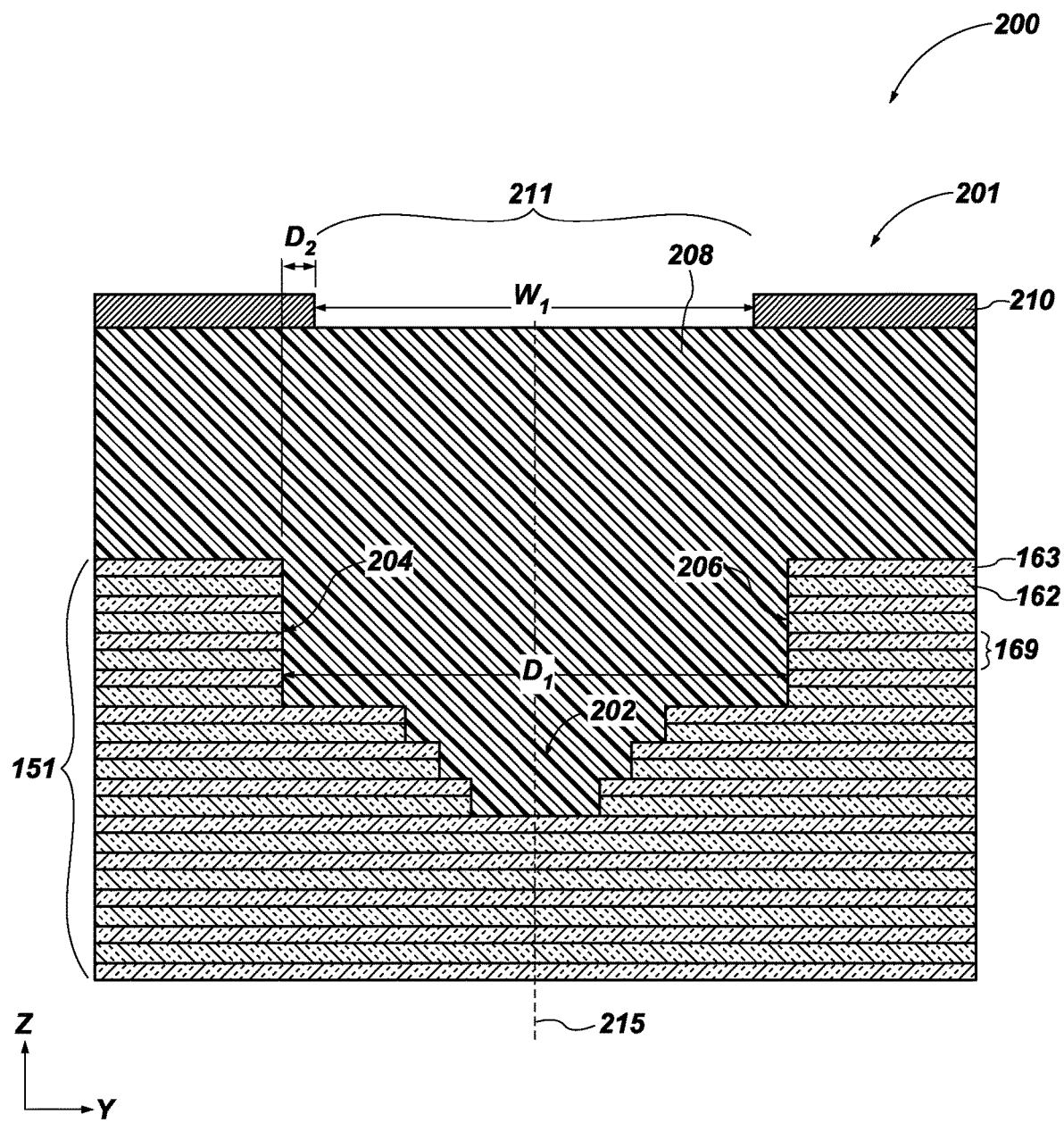

The method 200 may further include forming a mask 210 (e.g., a hard mask) over at least a portion of the photoresist material 208, as depicted in FIG. 2C. The mask 210 may define a mask opening 211 over the photoresist material 208 and vertically above the initial stadium structure 202. In one or more embodiments, the mask opening 211 has a width ($W_1$) in the Y-direction that is smaller than a distance ($D_1$) between the sidewalls 204, 206 in the Y-direction. Furthermore, the mask 210 may be formed to extend past horizontal boundaries of the sidewalls 204, 206 toward a center line 215 of the initial stadium structure 202. For example, the mask 210 may be formed to extend into a horizontal area of the initial stadium structure 202. In one or more embodiments, the mask 210 is formed to horizontally extend into a horizontal area of the initial stadium structure 202 by a distance ($D_2$) within a range of about 0.5 μm to about 5.0 μm from each lateral side (e.g., outermost horizontal boundary) of the initial stadium structure 202. In some embodiments, the distance ($D_2$) is within a range of about 0.75 μm to about 2.0 μm. In additional embodiments, the distance ($D_2$) is about 1.0 μm. In view of the foregoing, the width ($W_1$) of the mask opening 211 may be smaller than the distance ($D_1$) between the sidewalls 204, 206 by a magnitude within a range of from about 1.0 μm to about 10.0 μm.

Figure 2D:
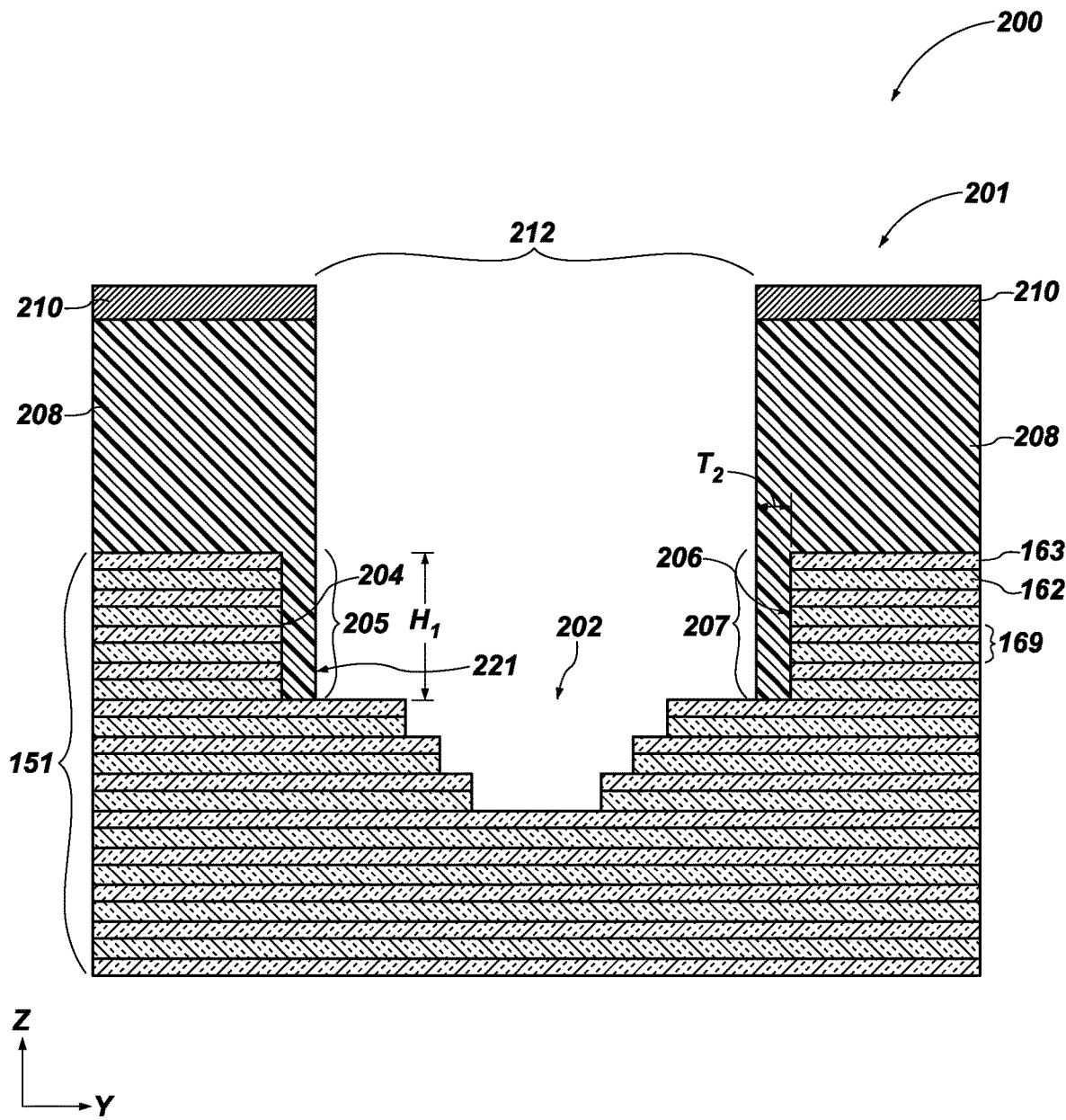

Additionally, the method 200 may include patterning (e.g., etching) the photoresist material 208 through the mask 210 to define a new opening 212 (e.g., trench) extending through the photoresist material 208 and exposing a portion (e.g., a middle portion) of the initial stadium structure 202, as shown in FIG. 2D. The new opening 212 may be narrowed (e.g., may have a reduced horizontal area) relative to the initial opening 203 (FIG. 2A) in the preliminary stack structure 151. In other words, the new opening 212 may have one or more reduced horizontal dimensions relative to the initial opening 203 (FIG. 2A).

In some embodiments, the photoresist material 208 may be patterned to leave photoresist material coatings 205, 207 along (e.g., directly horizontally adjacent and covering) the sidewalls 204, 206 of the preliminary stack structure 151 vertically overlying the initial stadium structure 202. In one or more embodiments, the photoresist material coatings 205, 207 have high-aspect-ratio dimensions within a vertical plane normal to the sidewalls 204, 206. For example, the photoresist material coatings 205, 207 may have heights ($H_1$) in the Z-direction that are significantly larger than thicknesses ($T_2$) of the photoresist material coatings 205, 207 in the Y-direction (e.g., a direction normal to the sidewalls 204, 206). In some embodiments, the height ($H_1$) is within a range of about 8.0 μm to about 15.0 μm, and the thickness ($T_2$) is within a range of about 0.5 μm to about 5.0 μm. In one or more embodiments, the height ($H_1$) is within a range of about 10.0 μm to about 15.0 μm, and the thickness ($T_2$) is within a range of about 0.75 μm to about 2.0 μm. In additional embodiments, the height ($H_1$) is about 15.0 μm, and the thickness ($T_2$) may be about 1.0 μm. In view of the foregoing, the photoresist material coatings 205, 207 may have aspect ratios within a range of about 3:1 to about 15:1.

In some embodiments, patterning (e.g., etching) the photoresist material 208 through the mask 210 includes patterning the photoresist material 208 via one or more high-aspect-ratio resist patterning processes (e.g., photolithography processes). For example, the photoresist material 208 may be exposed to electromagnetic radiation through the mask 210 and via a reticle (e.g., photo mask) and then subjected to a suitable developer (e.g., a positive tone developer, a negative tone developer). In some embodiments, such as embodiments wherein the photoresist material 208 comprises a positive tone photoresist, the resist patterning processes includes removing photoexposed portions of the photoresist material 208 while substantially retaining non-photoexposed portions of the photoresist material 208. Patterning the photoresist material 208 may, for example, include exposing the photoresist material 208 to a focused electromagnetic radiation according to a focus-exposure matrix (FEM). For example, patterning the photoresist material 208 may include exposing the photoresist material 208 to a focused beam of electromagnetic radiation using a focus offset within a range of about 6.0 μm to about 8.0 μm. As a non-limiting example, the focus offset may be about 7.0 μm.

The photoresist material 208 may be patterned to impart a desired profile 221 on laterals sides of the photoresist material coatings 205, 207 opposite the sidewalls 204, 206 and within the ZY plane (e.g., within a vertical plane normal to the sidewalls 204, 206), as depicted in FIG. 2D. Put another way, the photoresist material 208 may be patterned to form the photoresist material coatings 205, 207 to have a desired profile 221 within the ZY plane. In some embodiments, the profile 221 is at least substantially linear and is at least substantially vertical. In additional embodiments, the profile 221 is at least substantially linear and is oblique to a vertical axis. In further embodiments, the profile 221 is arcuate or irregular.

Figure 2E:
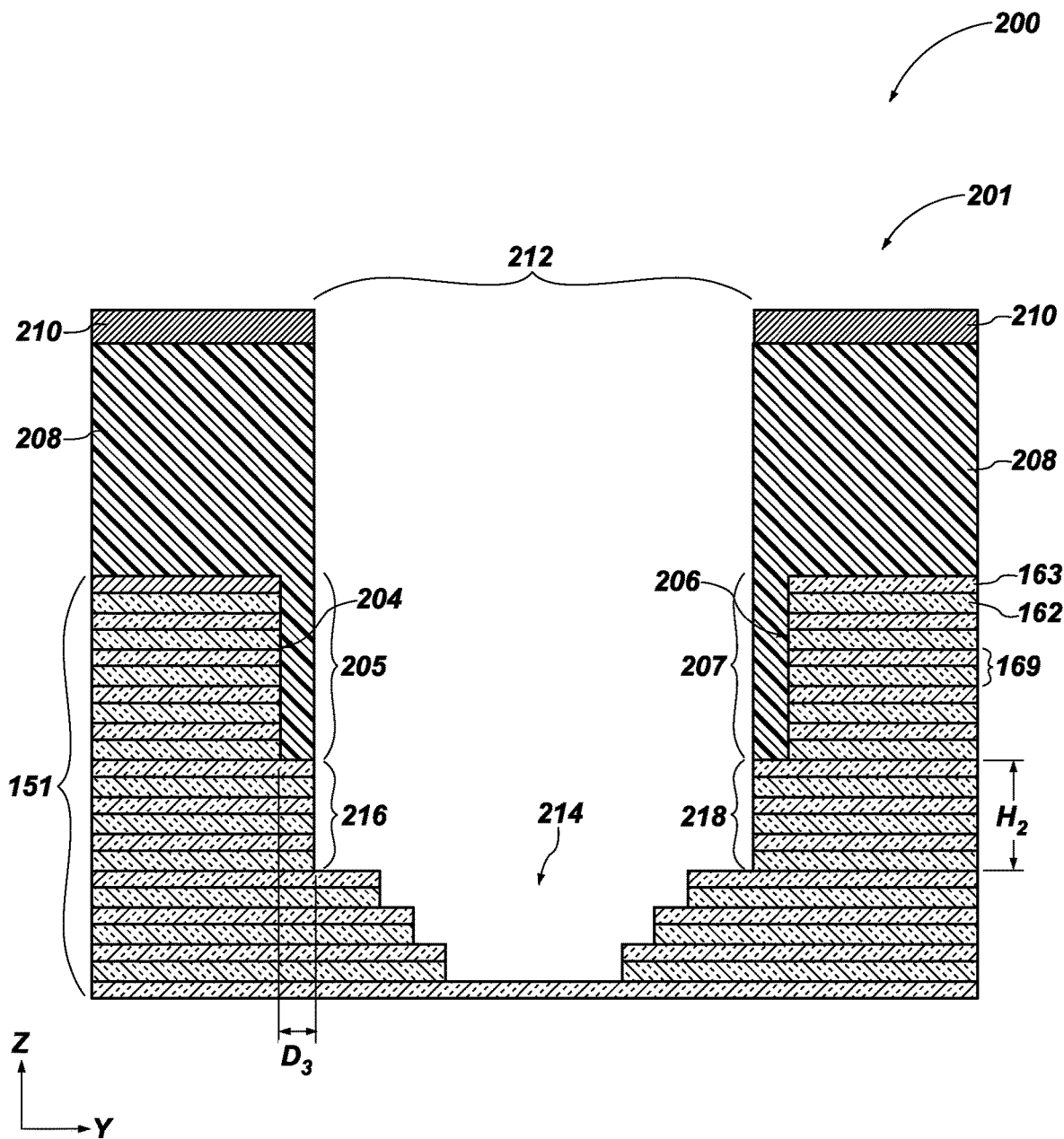
Figure 2F:
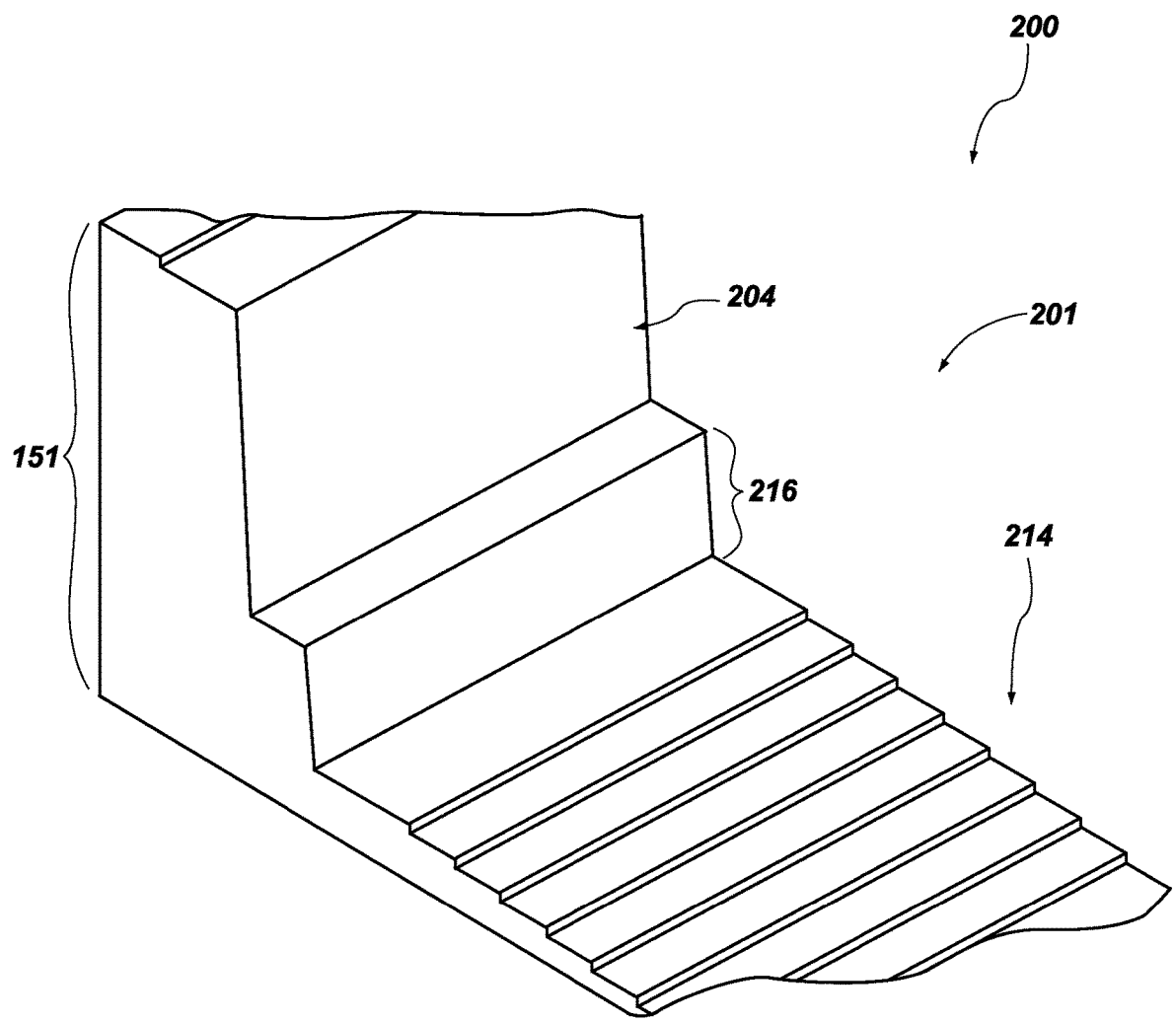

Next, the method 200 may include removing a portion of (e.g., chop etching) the preliminary stack structure 151 exposed by new opening 212 within the photoresist material 208 to transfer a pattern defined by the initial stadium structure 202 (FIG. 2D) to a vertically lower position (e.g., depth) within the preliminary stack structure 151, as shown in FIGS. 2E and 2F. FIG. 2F is a simplified, partial perspective view of the preliminary stack structure 151, with one or more features (e.g., structures, materials) removed to better show internal structure. Referring to FIGS. 2E and 2F together, removing a portion of the preliminary stack structure 151 to form a stadium structure 214 (e.g., a finale stadium structure) at a desired final vertical position within the preliminary stack structure 151. In some embodiments, the material removal process may include a conventional removal process (e.g., a conventional etching process, such as a conventional dry etching process). By way of non-limiting example, the preliminary stack structure 151 may be subjected to anisotropic etching (e.g., anisotropic dry etching, such as one or more of reactive ion etching (RIE), deep RIE, plasma etching, reactive ion beam etching, and chemically assisted ion beam etching or anisotropic wet etching) to form the stadium structure 214 at the desired vertical position within the preliminary stack structure 151.

Removing (e.g., etching) an exposed portion of the preliminary stack structure 151 through the new opening 212 of the photoresist material 208 may result in (e.g., include forming) ledges 216, 218 vertically beneath (e.g., vertically neighboring) and within horizontal boundaries (e.g., horizontal areas) of the photoresist material coatings 205, 207. The ledges 216, 218 may extend from the photoresist material coatings 205, 207 to the stadium structure 214. In other words, the ledges 216, 218 may extend vertically upward from the stadium structure 214. For instance, the ledges 216, 218 may extend upward from uppermost steps 111 (FIG. 1A) of the stadium structure 214. The ledges 216, 218 may be defined by (e.g., formed from) the tiers 169 of insulative structures 162 and sacrificial structures 163, and subsequent to a gate replacement process, the ledges 216, 218 may be defined by the tiers 168 (FIG. 1B) of the insulative structures 162 and conductive structures 164 (FIG. 1). In some embodiments, the ledges 216, 218 extend horizontally from the sidewalls 204, 206 in the Y-direction by a distance (D$_3$) within a range of about 0.5 µm to about 5.0 µm. The ledges 216, 218 may effectively comprise extensions of the sidewalls 204, 206. In some embodiments, the distance (D$_3$) may be within a range of about 0.75 µm to about 2.0 µm. In additional embodiments, the distance (D$_3$) may be about 1.0 µm. Put another way, each of the ledges 216, 218 may have a width of about 1.0 µm.

Furthermore, each of the ledges 216, 218 may have a height (H$_2$) that is at least substantially equal to a distance between an original vertical position of the initial stadium structure 202 (FIG. 2D) and the vertical position of the stadium structure 214. Referring to FIGS. 1, 2E, and 2F together, in some embodiments, the ledges 216, 218 may span, vertically, at least a same quantity of tiers 169 or tiers 168 as a quantity of tiers 169 or tiers 168 vertically spanned by another stadium structure of the stack structure 152. In some embodiments, the tiers 169 spanned by the ledges 216, 218 horizontally neighboring an individual stadium structure 214 is the same tiers 169 spanned by another stadium structure 214 within the preliminary stack structure 151. In some embodiments, a quantity of the tiers 169 spanned by the ledges 216, 218 horizontally neighboring an individual stadium structure 214 is the same as a quantity of the tiers 169 spanned by the stadium structure 214 within the preliminary stack structure 151. Consequently, collectively referring again to FIGS. 1A and 1, a quantity of the tiers 168 (FIG. 1B) spanned by the ledges 116,118 (FIG. 1A) horizontally neighboring an individual stadium structure 122 (e.g., corresponding to an individual stadium structure 214 (FIG. 2E)) within the stack structure 152 formed from the microelectronic device structure 201 (FIG. 2E) may be the same as a quantity of the tiers 168 spanned by the stadium structure 122. In addition, referring again to FIG. 2E, in some embodiments, an individual first ledge 216 and an individual second ledge 218 opposing the first ledge 216 span the same tiers 169 of the preliminary stack structure 151 as one another. In other embodiments, the first ledge 216 may span at least one tier 169 not spanned by the second ledge 218, or vice versa. In yet further embodiments, the first ledge 216 and the second ledge 218 may span entirely different tiers 169 than one another.

Referring to FIGS. 1A-2F together, as mentioned above, subsequent to forming the stadium structure 214, the preliminary stack structure 151 may be subjected to a replacement gate process, such the replacement gate processes described herein, to form the stack structure 152 (FIG. 1B) and the microelectronic device structure 100. Furthermore, openings above stadium structures 214 may ultimately be filled with dielectric materials.

The method 200 of finalizing vertical positions of stadium structures within a stack structure described herein provides advantages over conventional methods. Furthermore, the structure of the microelectronic device structures 100, 201 described herein provides advantages over conventional structures. In particular, conventional chop etch processes utilized to lower stadium structures within a stack structure often result in unintentional trenches (e.g., micro trenches) being formed through one or more steps of the eventual stadium structure at or proximate an interface between the stadium structure and sidewalls extending upward from the stadium structure. The foregoing often results in micro-trenching within active conductive structures (e.g., word lines) and may cause a loss of intended functionality and/or failure of the microelectronic device structure 201. However, coating the sidewalls (e.g., sidewalls 204, 206) extending between the initial stadium structure and an uppermost tier of a stack structure with a photoresist material to form resistive material coatings and then etching (e.g., chop etching) the stack structure and the stadium structure through a narrowed opening defined between the photoresist material coatings to finalize a vertical position of the stadium structure within the stack structure may reduce and/or prevent unintentional micro-trenching at the interfaces between the stadium structure and sidewalls extending upward from the stadium structure. For example, during the removal process (e.g., etching), the photoresist material coatings may absorb ion deflection off of the sidewalls, which otherwise may cause the micro-trenching in the stadium structure. Therefore, by absorbing the ions deflected off of the sidewalls, the photoresist material coatings may prevent the ions from being deflected into the stadium structure and causing micro-trenching in the stadium structure.

Moreover, by preventing unintentional micro-trenching in the stadium structure, the methods and structures described herein provide one or more of improved performance, reliability, and durability, lower costs, increased miniaturization of components, improved pattern quality, and greater packaging density as compared to conventional structures, conventional devices, and conventional systems.

Figure 3:
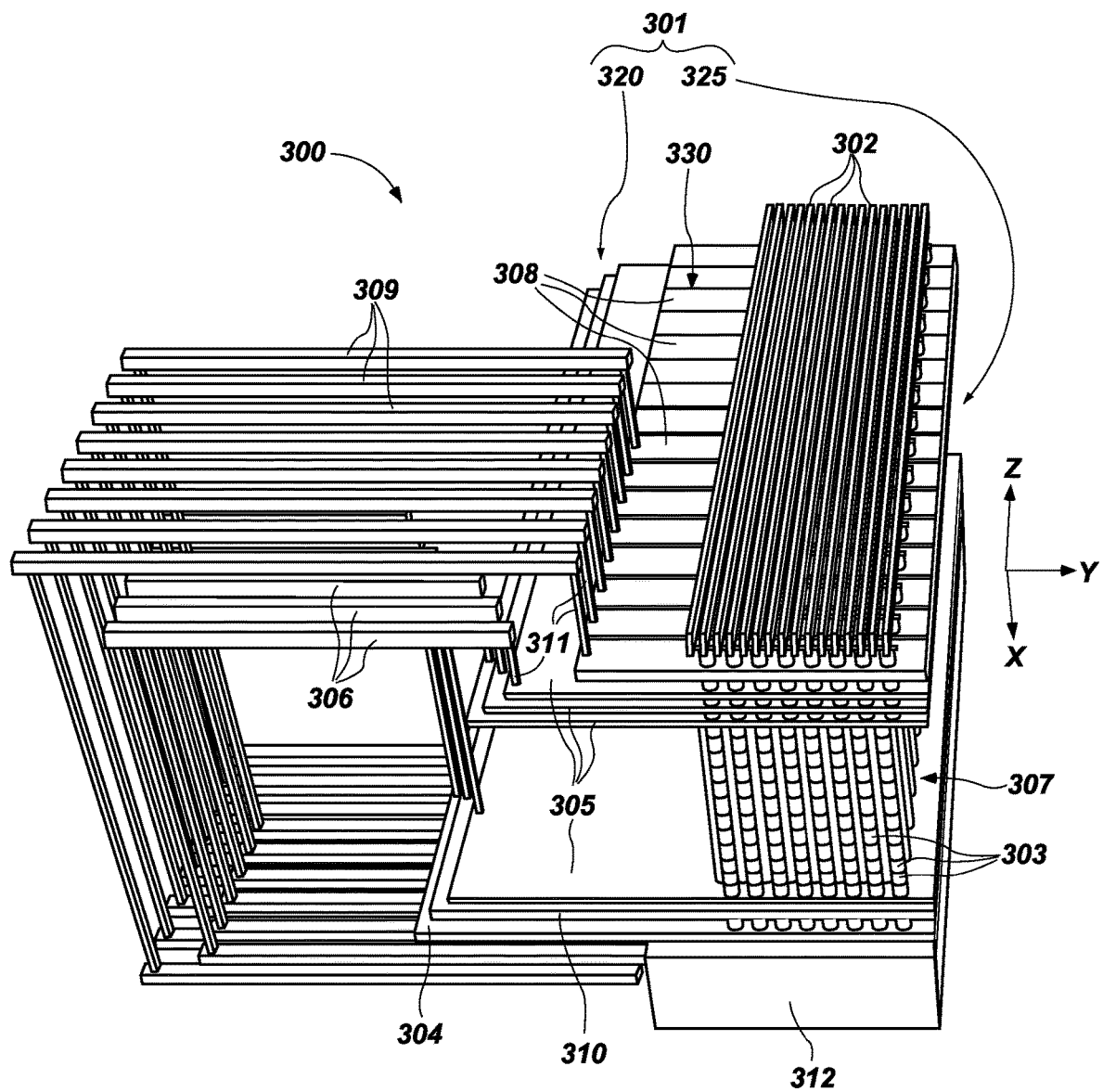
FIG. 3 is a simplified, cutaway perspective view of a microelectronic device, according to embodiments of the disclosure.

FIG. 3 illustrates a partial cutaway perspective view of a portion of a microelectronic device 300 (e.g., a memory device, such as a 3D NAND Flash memory device) including a microelectronic device structure 301. The microelectronic device structure 301 may be substantially similar to the microelectronic device structure 100 previously described with reference to FIG. 1A and FIG. 1B; and may be formed, in part, in accordance with the method 200 previously described herein with reference to FIG. 2A through FIG. 2F. As shown in FIG. 3, the microelectronic device structure 301 may include a stack structure 325 (e.g., corresponding to the stack structure 152 (FIG. 1B)) and at least one stair step structure 320 (e.g., corresponding to the stair step structures 112 (FIGS. 1A and 1B)) within the stack structure 325 and defining contact regions for connecting access lines 306 to conductive structures 305 (e.g., corresponding to the conductive structures 164 (FIG. 1)). The microelectronic device structure 301 may include vertical strings 307 of memory cells 303 coupled to each other in series. The vertical strings 307 may extend vertically (e.g., in the Z-direction) and orthogonally to the conductive structures 305 and to conductive lines, such as data lines 302, a source tier 304 (e.g., corresponding to the source tier 154 (FIG. 1)), the access lines 306, first select gates 308 (e.g., upper select gates, drain select gates (SGDs), such as the conductive structures 164 (FIG. 1)), select lines 309, and a second select gate 310 (e.g., a lower select gate, a source select gate (SGS)). The select gates 308 may be horizontally separated (e.g., in the X-direction) from one another by filled slots 330.

Vertical conductive contacts 311 may couple components to each other as shown. For example, the select lines 309 may be coupled to the first select gates 308 and the access lines 306 may be coupled to the conductive structures 305. The microelectronic device 300 may also include a control unit 312 positioned under the vertical strings 307 of memory cells 303. The control unit 312 may include at least one logic region including logic devices configured to control various operations of other features (e.g., the vertical strings 307 of memory cells 303) of the microelectronic device 300. For example, the logic region of the control unit 312 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), buffers (e.g., page buffers), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The logic circuitry of the logic region of the control unit 312 may be coupled to the data lines 302, the source tier 304, the access lines 306, the first select gates 308, and the second select gates 310, for example. In some embodiments, the logic region of the control unit 312 includes CMOS (complementary metal-oxide-semiconductor) circuitry. In some such embodiments, the logic region of the control unit 312 may be characterized as having a "CMOS under Array" ("CuA") configuration, wherein the CMOS circuitry of the logic region is at least partially (e.g., substantially) positioned within a horizontal area of the memory array region (including the vertical strings 307 of memory cells 303 therein) of the microelectronic device 300.

Thus, in accordance with embodiments of the disclosure, a microelectronic device includes a stack structure including a vertically alternating sequence of conductive structures and insulating structures arranged in tiers, a dielectric-filled opening vertically extending into the stack structure and defined between two internal sidewalls of the stack structure, a stadium structure within the stack structure and comprising steps defined by horizontal ends of at least some of the tiers, a first ledge extending upward from a first uppermost step of the steps of the stadium structure and interfacing with a first internal sidewall of the two internal sidewalls of the stack structure, and a second ledge extending upward from a second, opposite uppermost step of the steps of the stadium structure and interfacing with a second, opposite internal sidewall of the two internal sidewalls.

Additional embodiments of the disclosure include a microelectronic device, including a first stadium structure within a stack structure including tiers of conductive structures vertically interleaved with insulative structures, the first stadium structure comprising opposing staircase structures including steps defined by horizontal ends of a first group of the tiers of the stack structure, a first ledge vertically overlying first stadium structure and including horizontal ends of a second group of the tiers of the stack structure, the horizontal ends each terminating at a first horizontal position, a second ledge horizontally opposing the first ledge and including additional horizontal ends of the second group of the tiers of the stack structure, the additional horizontal ends each terminating at a second horizontal position different than the first horizontal position, and opposing sidewalls vertically overlying the first ledge and the second ledge and comprising further horizontal ends of a third group of the tiers of the stack structure, the further horizontal ends horizontally offset from all of the horizontal ends and all of the additional horizontal ends.

Embodiments of the disclosure further include a method of forming a microelectronic device, the method including: forming an initial stadium structure in a stack structure, the stack structure defining two internal sidewalls extending upward from uppermost steps of the initial stadium structure; forming photoresist coatings over the two internal sidewalls, the photoresist coatings defining an opening over the initial stadium structure; and removing portions of the stack structure vertically underlying and within a horizontal area of the opening to form a final stadium structure at a relatively lower vertical position within the stack structure than the initial stadium structure.

Figure 4:
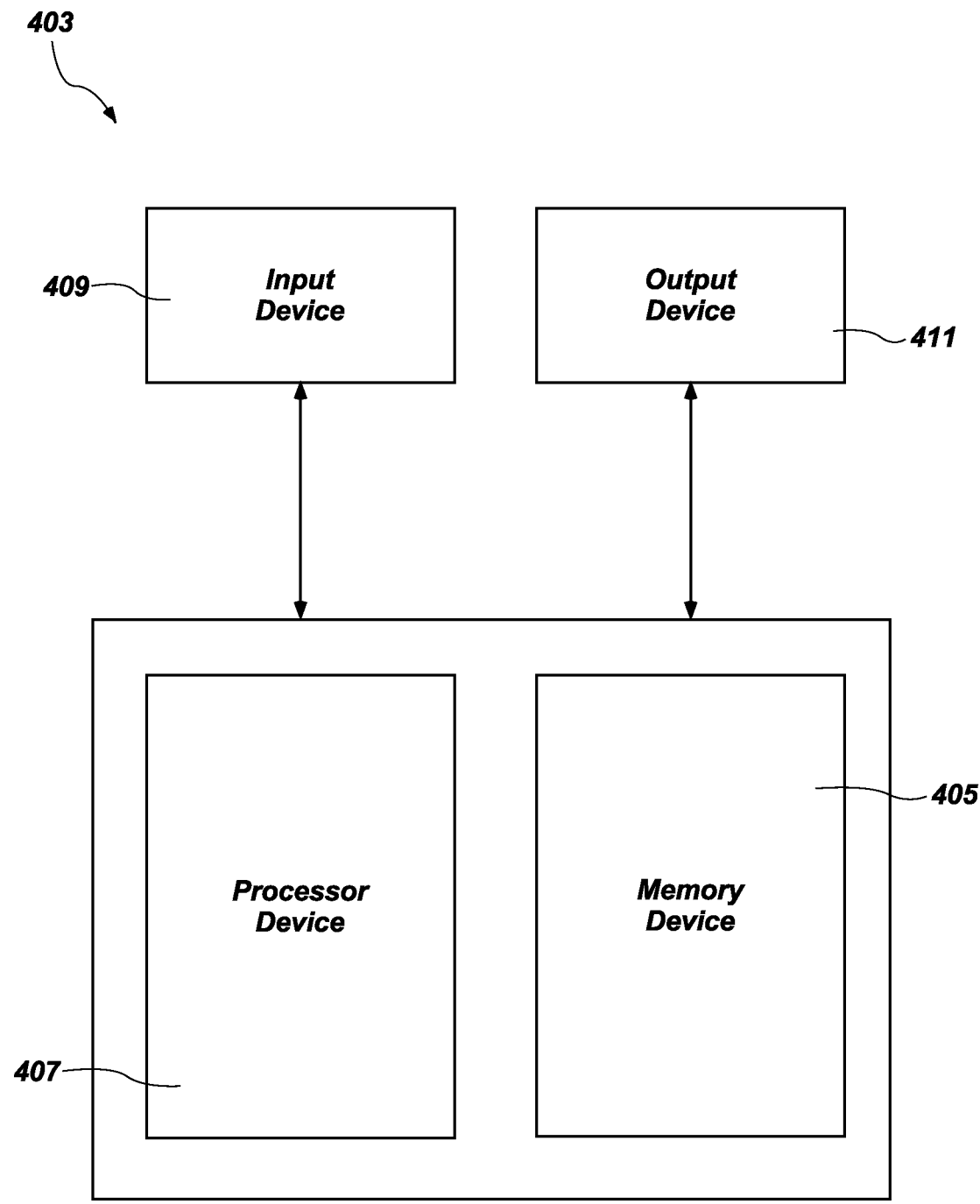
FIG. 4 is a schematic block diagram of an electronic system, in accordance with embodiments of the disclosure.

Referring next to FIG. 4, depicted is a schematic block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., the microelectronic device structure 100, 301) or a microelectronic device (e.g., the microelectronic device 300) previously described herein.

The electronic system 403 may further include at least one electronic signal processor device 407 (often referred to as a "microprocessor"). The electronic signal processor device 407 may, optionally, include an embodiment of a microelectronic device or a microelectronic device structure previously described herein (e.g., one or more of the microelectronic device 300 and the microelectronic device structure 100, 301). The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 5:
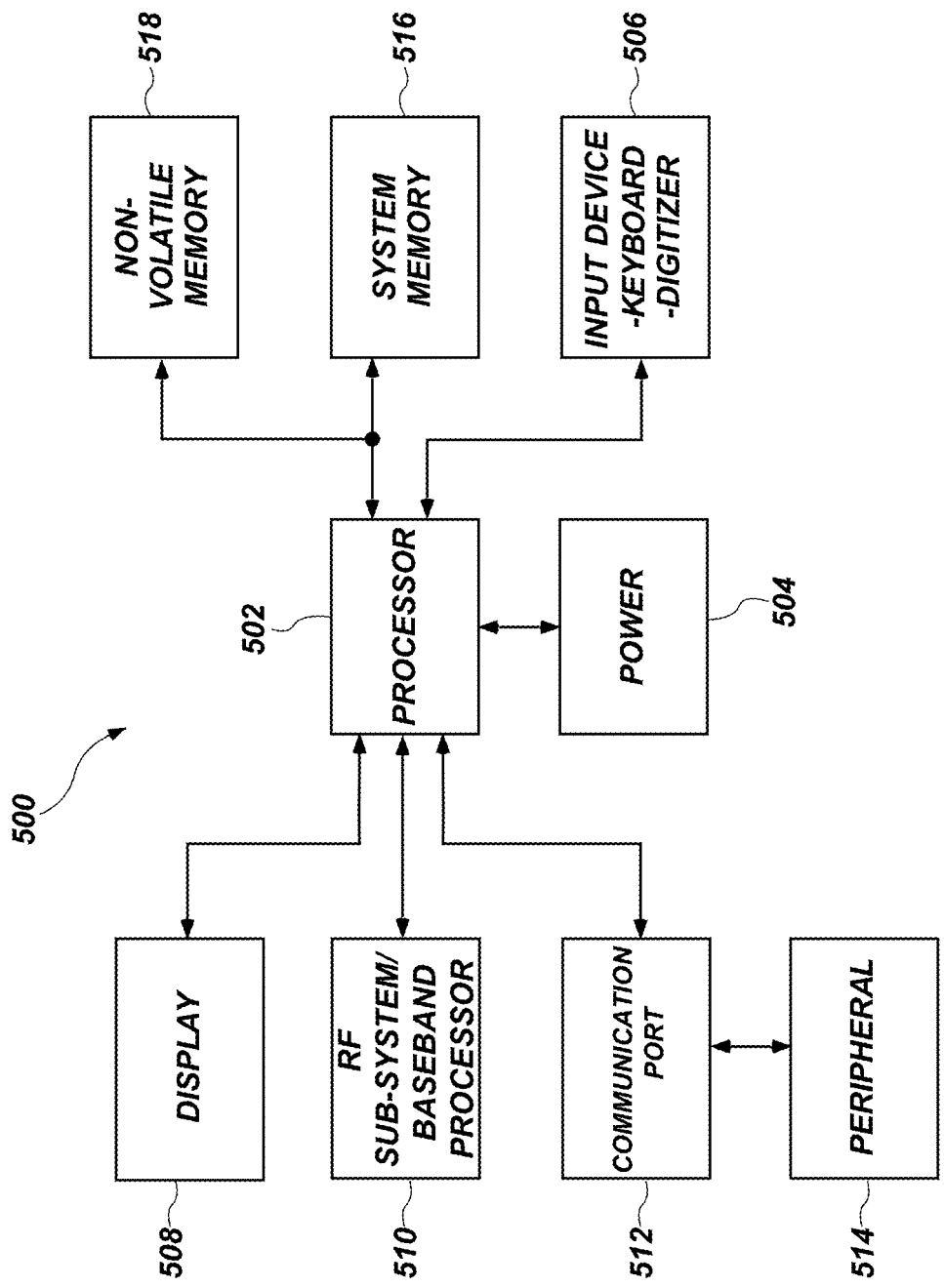
FIG. 5 is a schematic block diagram of a processor-based system, in accordance with embodiments of the disclosure.

With reference to FIG. 5, depicted is a processor-based system 500. The processor-based system 500 may include various microelectronic devices and microelectronic device structures (e.g., microelectronic devices and microelectronic device structures including one or more of the microelectronic device 300 and the microelectronic device structure 100, 301) manufactured in accordance with embodiments of the present disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include microelectronic devices and microelectronic device structures (e.g., microelectronic devices and microelectronic device structures including one or more of the microelectronic device 300 or the microelectronic device structure 100, 201, 301) manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as the microelectronic devices and microelectronic device structures (e.g., the microelectronic device 300 and the microelectronic device structure 100, 201, 301) described above, or a combination thereof.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as the microelectronic devices and microelectronic device structures (e.g., the microelectronic device 300 and the microelectronic device structure 100, 201, 301) described above, or a combination thereof.

Thus, in accordance with embodiments of the disclosure, an electronic system, including an input device, an output device, a processor device operably coupled to the input device and the output device, and a memory device operably coupled to the processor device and comprising at least one microelectronic device. The at least one microelectronic device may include a first stadium structure formed at a first vertical position within a stack structure, a first set of ledges extending upward from uppermost steps of the first stadium structure and vertically spanning a first group of tiers of the stack structure, a second stadium structure formed at a second vertical position and vertically spanning the first group of tiers as the first set of ledges, and a second set of ledges extending upward from uppermost steps of the second stadium structure and vertically spanning a second group of tiers of the stack structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure comprising a vertically alternating sequence of conductive structures and insulating structures arranged in tiers, a dielectric-filled opening vertically extending into the stack structure and defined between two substantially vertical internal sidewalls of the stack structure defined by horizontal ends of an uppermost group of the tiers;
   stadium structures within the stack structure, each of the stadium structures comprising a first staircase structure and a second staircase structure symmetrical with and opposing the first staircase structure, the first staircase structure and the second staircase structure respectively having steps defined by horizontal ends of an additional group of the tiers vertically below the uppermost group of the tiers;
   two opposing ledges defined by horizontal ends of a further group of the tiers vertically extending from and between the uppermost group of the tiers and the additional group of the tiers, the two opposing ledges comprising:
      a first ledge extending from an uppermost one of the steps of the first staircase structures of the respective stadium structure to a first of the two substantially vertical internal sidewalls of the stack structure; and
      a second ledge extending from an uppermost one of the steps of the second staircase structures of the respective stadium structure to a second of the two substantially vertical internal sidewalls of the stack structure.

2. The microelectronic device of claim 1, wherein each of the first ledge and the second ledge has a width in a direction normal to the two substantially vertical internal sidewalls within a range of from about 0.5 μm to about 5.0 μm.

3. The microelectronic device of claim 1, wherein each of the first ledge and the second ledge has a width in a direction normal to the two substantially vertical internal sidewalls of about 1.0 μm.

4. The microelectronic device of claim 1, wherein the stadium structures within the stack structure comprises a stadium structure and an additional stadium structure within the stack structure, the additional stadium structure at a relatively higher vertical position than the stadium structure.

5. The microelectronic device of claim 1, wherein the two substantially vertical opposing sidewalls of the stack structure continuously vertically extend from an uppermost boundary of the stack structure to the two opposing ledges.

6. The microelectronic device of claim 1, wherein the two opposing ledges comprise two additional substantially vertical internal sidewalls of the stack structure individually defined by further horizontal ends of the further group of the tiers.

7. The microelectronic device of claim 6, wherein the two opposing ledges further comprise two upper surfaces horizontally extending continuously and substantially linearly from the two additional substantially vertical internal sidewalls of the stack structure to the two substantially vertical internal sidewalls of the stack structure.

8. The microelectronic device of claim 1, wherein an entire vertical span of the further group of the tiers of the stack structure is less than that of the uppermost group of the tiers of the stack structure.

9. The microelectronic device of claim 1, wherein an entire vertical span of the further group of the tiers of the stack structure is greater than that of the uppermost group of the tiers of the stack structure.

10. The microelectronic device of claim 1, wherein:
    the uppermost group of the tiers of the stack structure includes at least three of the tiers of the stack structure; and
    the further group of the tiers of the stack structure includes at least three others of the tiers of the stack structure.

11. The microelectronic device of claim 1, further comprising an additional dielectric-filled opening horizontally offset from the dielectric-filled opening and vertically extending into the stack structure, the additional dielectric-filled opening defined between two further substantially vertical internal sidewalls of the stack structure defined by additional horizontal ends of the uppermost group of the tiers and additional horizontal ends of the further group of the tiers.

12. The microelectronic device of claim 11, further comprising an additional stadium structure within the stack structure and comprising additional opposing staircase structures respectively having additional steps defined by horizontal ends of another group of the tiers of the stack structure vertically below the additional group of the tiers of the stack structure.

13. The microelectronic device of claim 12, further comprising two additional opposing ledges defined by additional horizontal ends of the additional group of the tiers of the stack structure.

14. The microelectronic device of claim 13, wherein the two additional opposing ledges comprise:
    a first additional ledge extending from an uppermost one of the additional steps of a first of the additional opposing staircase structures of the additional stadium structure to a first of the two further substantially vertical internal sidewalls of the stack structure; and
    a second additional ledge extending from an uppermost one of the additional steps of a second of the additional opposing staircase structures of the additional stadium structure to a second of the two further substantially vertical internal sidewalls of the stack structure.

* * * * *

UNITED STATES PATENT AND TRADEMARK OFFICE
CERTIFICATE OF CORRECTION

| | | |
|---|---|---|
| PATENT NO. | : 12,406,926 B2 | |
| APPLICATION NO. | : 17/564633 | |
| DATED | : September 2, 2025 | |
| INVENTOR(S) | : Bo Zhao et al. | |

Page 1 of 1

It is certified that error appears in the above-identified patent and that said Letters Patent is hereby corrected as shown below:

In the Specification

| | | |
|---|---|---|
| Column 10, | Lines 3-4, | change "in FIG. 1). As" to --in FIG. 1B). As-- |
| Column 10, | Line 23, | change "(FIG. 1). A method" to --(FIG. 1B). A method-- |
| Column 10, | Line 58, | change "111 (FIG. 1). After" to --111 (FIG. 1B). After-- |
| Column 11, | Line 2, | change "202 may subjected" to --202 may be subjected-- |
| Column 13, | Lines 44-45, | change "164 (FIG. 1). In" to --164 (FIG. 1B). In-- |
| Column 13, | Line 58, | change "FIGS. 1, 2E, and" to --FIGS. 1B, 2E, and-- |
| Column 14, | Line 5, | change "FIGS. 1A and 1, a" to --FIGS. 1A and 1B, a-- |
| Column 15, | Lines 20-21, | change "164 (FIG. 1)). The microelectronic" to --164 (FIG. 1B)). The microelectronic-- |
| Column 15, | Lines 26-27, | change "(FIG. 1)), the access" to --(FIG. 1B)), the access-- |
| Column 15, | Line 29, | change "structures 164 (FIG. 1)), select lines" to --structures 164 (FIG. 1B)), select lines-- |

Signed and Sealed this
Seventh Day of October, 2025

John A. Squires
*Director of the United States Patent and Trademark Office*